(12) United States Patent
Lee et al.

(10) Patent No.: US 7,365,979 B2
(45) Date of Patent: Apr. 29, 2008

(54) HEAT DISSIPATING ASSEMBLY WITH FAN FASTENING DEVICE

(75) Inventors: Hsieh-Kun Lee, Tu-Cheng (TW);
Chun-Chi Chen, Tu-Cheng (TW);
Shin-Hsuu Wung, Tu-Cheng (TW);
Guang Yu, Shenzhen (CN); Yong-Dong Chen, Shenzhen (CN)

(73) Assignees: Fu zhun Precision Industry (Shenzhen) Co., Ltd., Bao'an District, Shenzhen, Guangdong Province (CN);
Foxconn Technology Co., Ltd., Tu-Chen, Taipei Hsien (TW)

( * ) Notice: Subject to any disclaimer, the term of this patent is extended or adjusted under 35 U.S.C. 154(b) by 57 days.

(21) Appl. No.: 11/265,368

(22) Filed: Nov. 1, 2005

(65) Prior Publication Data

US 2007/0097632 A1 May 3, 2007

(51) Int. Cl.
*H05K 7/20* (2006.01)
(52) U.S. Cl. ............................ 361/697; 165/80.3
(58) Field of Classification Search ............... 361/697, 361/695; 65/80.3
See application file for complete search history.

(56) References Cited

U.S. PATENT DOCUMENTS

| 5,495,392 | A |  | 2/1996 | Shen | |
|---|---|---|---|---|---|
| 5,677,829 | A |  | 10/1997 | Clemens | |
| 5,943,209 | A | * | 8/1999 | Liu | 361/695 |
| 6,311,766 | B1 |  | 11/2001 | Lin et al. | |
| 6,341,644 | B1 | * | 1/2002 | Lo et al. | 165/80.3 |
| 6,520,250 | B2 |  | 2/2003 | Lee et al. | |
| 6,525,941 | B1 | * | 2/2003 | Lai | 361/697 |
| 6,538,888 | B1 | * | 3/2003 | Wei et al. | 361/697 |
| 6,822,864 | B2 | * | 11/2004 | Huang et al. | 361/697 |
| 6,860,323 | B2 | * | 3/2005 | Cheng | 165/121 |
| 6,924,982 | B2 | * | 8/2005 | Chen et al. | 361/697 |
| 6,978,827 | B2 | * | 12/2005 | Armstrong | 165/80.3 |
| 7,072,183 | B2 | * | 7/2006 | Lee et al. | 361/704 |

FOREIGN PATENT DOCUMENTS

TW 527089 4/2003

* cited by examiner

*Primary Examiner*—Michael C. Zarroli
(74) *Attorney, Agent, or Firm*—Morris Manning Martin LLP; Tim Tingkang Xia, Esq.

(57) ABSTRACT

A heat dissipating device (8) includes a heat sink (40), a first and a second fixing members (2, 3) mounted on the heat sink, a lever (1) pivotably mounted to the second fixing member, a fan holder (5) and a fan (6) mounted on the fan holder. A pair of mounting holes (26) is defined in the first fixing member. A catch (38) is bent from the second fixing member for clasping the lever. The fan holder includes a pair of tongues engaged in the mounting holes of the first fixing member, and a U-shaped receiving portion (58) receiving and downwardly pressed by the lever.

18 Claims, 3 Drawing Sheets

HEAT DISSIPATING ASSEMBLY WITH FAN FASTENING DEVICE

BACKGROUND

1. Field

The present invention relates to a heat dissipating assembly having a heat sink and a fan, and more particularly to a heat dissipating assembly having a fan fastening device, which are facilitated to install and/or to remove the fan.

2. Related Art

As computer technology continues to advance, electronic components such as central processing units (CPUs) of computers are made to provide faster operational speeds and greater functional capabilities. When a CPU operates at a high speed in a computer, its temperature frequently increases greatly. Cooling is especially important for the CPU of the computer. Without proper cooling, the heat generated by the CPU can quickly cause the CPU to overheat and damage the CPU. It is desirable to dissipate the heat quickly, for example using a heat sink system assembled within the computer, so that the CPU of the computer operates in normal temperature range.

A conventional heat sink system mounted on CPUs generally includes a heat sink and a cooling fan having plurality of fins. In the conventional assembling method, the fan is locked onto the heat sink by screws interferentially engaged with the fins of the heat sink. However, the previously mentioned assembling method requires screws and a screwdriver to perform these procedures. As known by those skilled persons, the conventional method wastes time and manpower. Additionally, the fins are generally thin and are liable to be deflected. Thus, the screws may loosen from the fins. The fan is liable to operate less efficiently, and may even become unserviceable.

To overcome the problems of the above-mentioned heat dissipation assembly, U.S. Pat. No. 6,520,250 B2 provides a heat dissipation assembly having a fan holder to mount a fan to a heat sink. The fan holder comprises a base defining an opening therethrough, two pair of hooks, two pairs of posts around the opening, a pair of positioning blocks, and two pairs of slots defined in the base. The hooks depend from the base, and engage in grooves defined through fins of the heat sink. The posts extend upwardly from the base, and are received in corresponding holes of the fan. Thus, the fan is mounted to the heat sink without screws. However, in disassembly of the fan holder, a tool must be used to disengage the hooks from the heat sink. It is must gingerly to disassemble the fan holder to prevent other electronic components from being damaged by the tool.

Therefore, it is desired to design a novel heat dissipating assembly to overcome the aforementioned problems.

SUMMARY

Accordingly, what is needed is a heat dissipating device which has a fan fastening device being facilitated to install and/or to remove the fan.

A heat dissipating device in accordance with the present invention comprises a heat dissipating device including a heat sink having a plurality of fins, a first fixing member and a second fixing member mounted on the heat sink, a lever pivotably mounted to the second fixing member, a fan holder and a fan mounted on the fan holder. A pair of mounting holes is defined in the first fixing member. A catch is bent from the second fixing member, for engaging with the lever. A sleeve is formed at an edge of the second fixing member. The lever comprises a locating portion received in the sleeve of the second fixing member, an operating portion extending perpendicularly from an end of the locating portion and a handle portion bent from an end of the operating portion. The fan holder comprises a pair of tongues engaged in the mounting holes of the first fixing member, and a U-shaped receiving portion engaged with the operating portion of the lever. The operating portion of the lever downwardly presses the U-shaped receiving portion and is clasped by the catch.

Other advantages and novel features of the present invention will become more apparent from the following detailed description when taken in conjunction with the accompanying drawings, in which:

DETAILED DESCRIPTION OF THE PREFERRED EMBODIMENT

Figure 1:
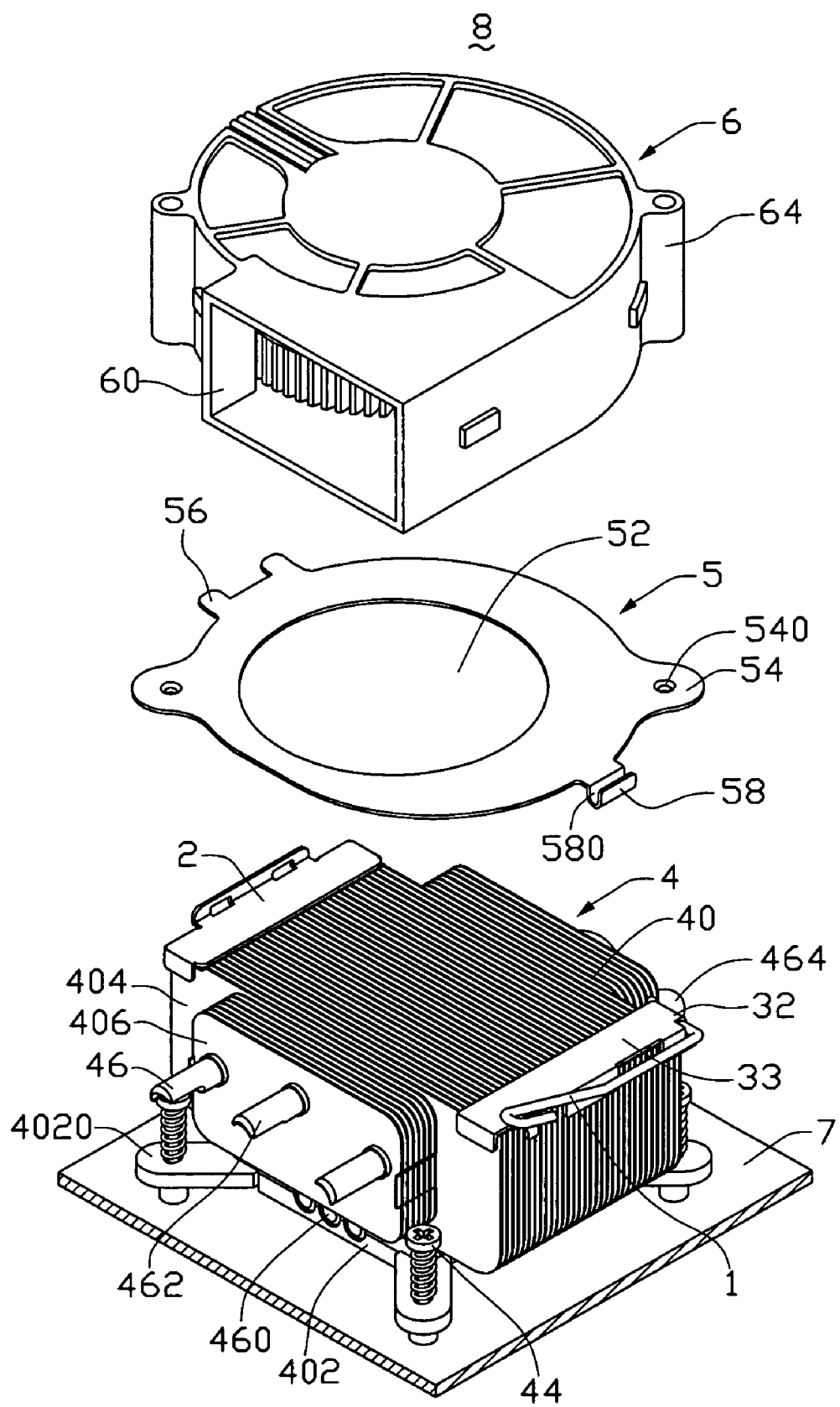
FIG. 1 is an exploded, isometric view of a heat dissipating device in accordance with a preferred embodiment of the present invention.
Figure 2:
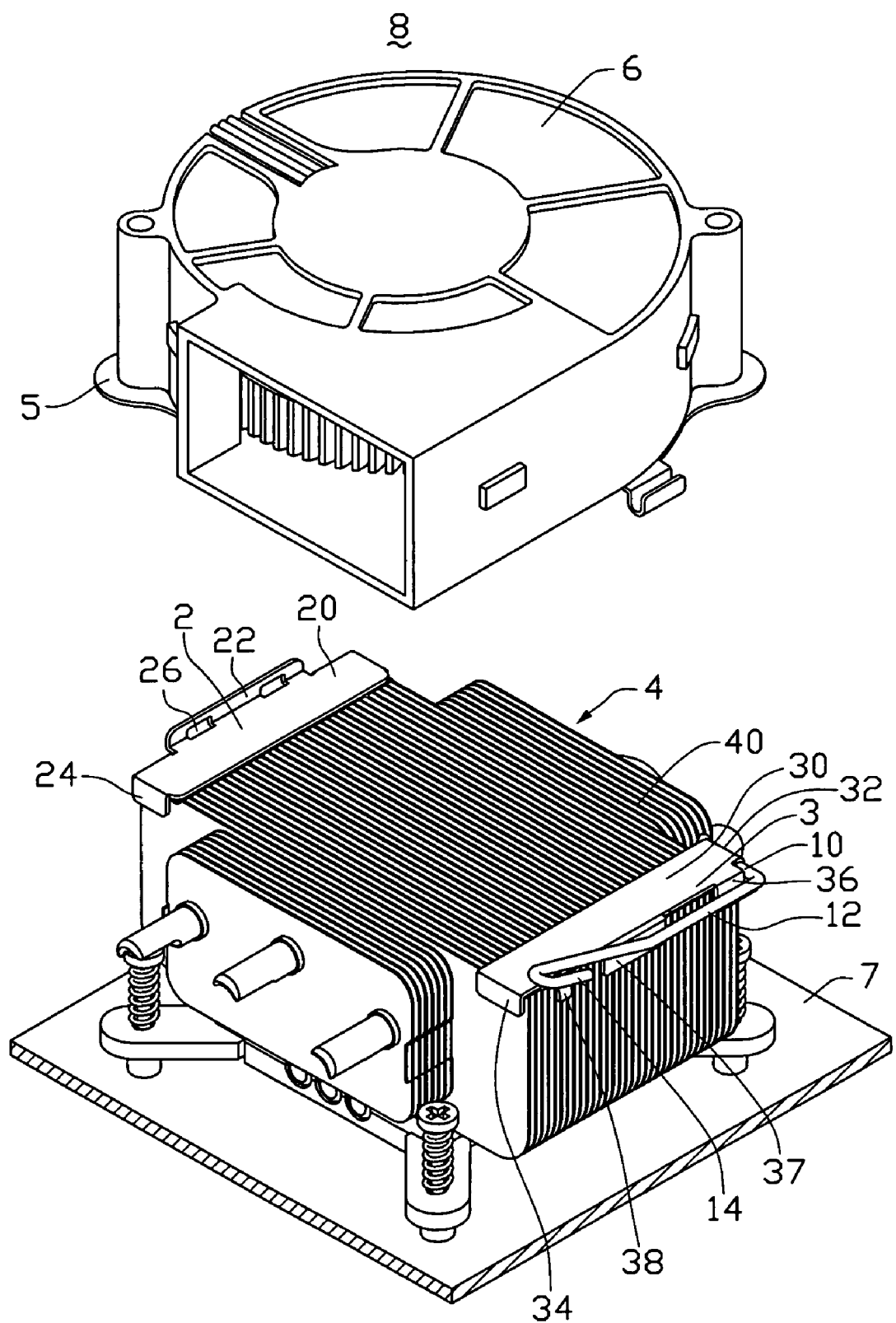
FIG. 2 is a partly assembled view of FIG. 1.
Figure 3:
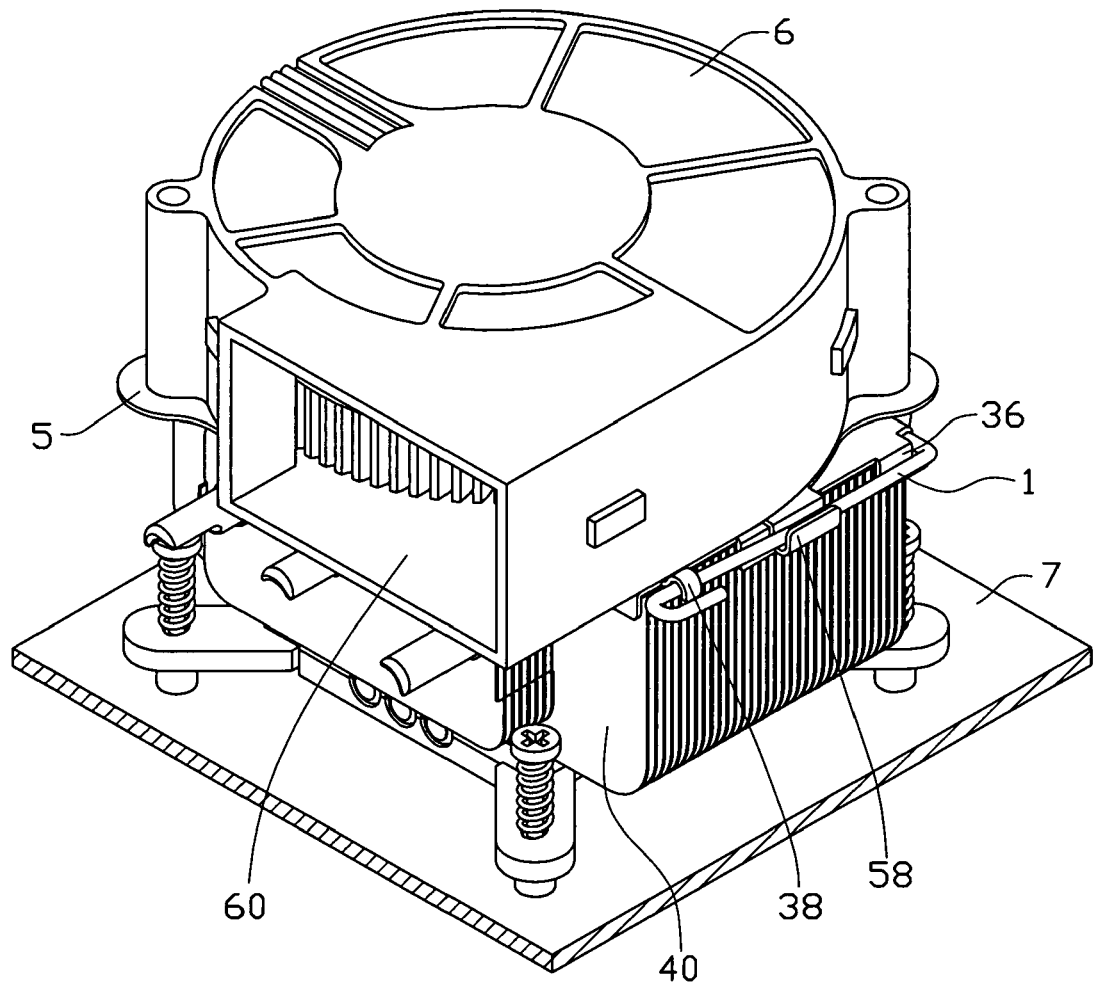
FIG. 3 is an assembled view of FIG. 1.

Referring to FIGS. 1-3, a heat dissipating device 8 according to a preferred embodiment of the invention is mounted in a computer case (not shown), and comprises a heat sink assembly 4, a fan 6 and a fan holder 5. The heat sink assembly 4 comprises a heat sink 40, a first fixing member 2, a second fixing member 3, and a lever 1 pivotably mounted to the second fixing member 3 for engaging with the fan holder 5. In this embodiment, a combination of the fan holder 5, the lever 1, the first fixing member 2 and the second fixing member 3 form a fan fastening device.

The heat sink 40 comprises a heat spreader 402, a plurality of first fins 404 extending upwardly from the heat spreader 402 and a plurality of second fins 406 attached to front and rear sides of the first fins 404. The heat spreader 402 forms four ears 4020 extending outwardly from four corners thereof. The heat sink 40 thermally engages with a CPU (not shown) mounted on a PCB 7 (printed circuit board) by extending four fasteners 44 through the four ears 4020 to threadedly engage with a retainer (not shown) attached to a bottom side of the PCB 7. Three parallel heat pipes 46 are received in the heat sink 40. Each heat pipe 46 generally has a U-shaped configuration. Each heat pipe 46 comprises an evaporating portion 460, a condensing portion 462 parallel to the evaporating portion 460 and a connecting portion 464 connecting the evaporating portion 460 with the condensing portion 462. The evaporating portions 460 of the heat pipes 46 are received between the heat spreader 402 and a bottom portion of the first fins 404 such that the evaporating portions 460 and the heat spreader 402 are thermally connected together, which means that heat received by the heat spreader 402 can be immediately transferred to the evaporating portions 460. The condensing portions 462 of the heat pipes 46 extend through top portion of the first and the second fins 404, 406 such that the heat received by the evaporating portions 460 can be quickly transferred to the top portion of the first and the second fins 404, 406 via the condensing portions 462.

Particularly referring also to FIG. 2, the lever 1 comprises a locating portion 10, an operating portion 12 extending perpendicularly from an end of the locating portion 10 and a handle portion 14 bent from an end of the operating portion 12. The locating portion 10 is pivotably connected to a rear end of the second fixing member 3, whereby the lever 1 can be pivoted upwardly away from the second fixing member 3, or downwardly toward the second fixing member 3.

The first fixing member 2 and the second fixing member 3 are soldered on two lateral sides of a top of the heat sink 40, respectively. The first fixing member 2 comprises a first mounting plate 20, a wing 22 extending upwardly from an external lateral side of the first mounting plate 20, and a pair of first tabs 24 extending downwardly from front and rear edges of the first mounting plate 20. A pair of mounting holes 26 is defined at a joint of the first mounting plate 20 and the wing 22.

The second fixing member 3 comprises a second mounting plate 30. A second tab 34 extends downwardly from a front edge of the second mounting plate 30. A sleeve 32 is formed at a rear edge of the mounting plate 30 and adjacent to the rear side of the first fins 404. The locating portion 10 of the lever 1 is pivotably received in the sleeve 32. A U-shaped supporting member 36 is formed at an external lateral side of the mounting plate 30 and adjacent to the sleeve 32, for supporting the operating portion 12 of the lever 1 thereon to prevent the lever 1 from sliding downwardly from the second fixing member 3. A securing plate 37 extends perpendicularly and downwardly from a middle of the external lateral side of the mounting plate 30, for preventing the operating portion 12 of the lever 1 from interferefering with the first fins 404 of the heat sink 40 during operation of the lever 1. A catch 38 bends arcuately from the external lateral side of the mounting plate 30 towards the second fins 404, for engaging with the corresponding portion of the operating portion 12 of the lever 1.

Particularly referring to FIG. 1, the fan holder 5 is formed by stamping and bending a single metal plate. The fan holder 5 generally has a circular configuration and comprises a central opening 52. A pair of tongues 56 extends horizontally from the fan holder 5, for engaging in the mounting holes 26 of the first fixing member 2. A combination of the tongues 56 and the mounting holes 26 acts as a first interlocking device to provide a detachable connection between the fan holder 5 and the heat sink assembly 4. The fan holder 5 forms a receiving portion 58 generally opposite the tongues 56 and located adjacent to an outside of the securing plate 37 of the second fixing member 3 when the fan holder 5 is mounted on the heat sink assembly 4. The receiving portion 58 generally has a U-shaped configuration to form a recess 580 for receiving the operating portion 12 of the lever 1. A combination of the receiving portion 58, the catch 38 and the lever 1 acts as a second interlocking device to provide a detachable connection between the fan holder 5 and the heat sink assembly 4. The receiving portion 58 partly contacts the securing plate 37, for preventing the receiving portion 58 from deforming due to the pressure of the operating portion 12 acting on the receiving portion 58 during operation of the lever 1. A pair of opposite lugs 54 extends horizontally from the fan holder 5. In assembly, the lugs 54 are located on opposite diagonal corners of the first fins 404 of the heat sink 40, respectively. Each lug 54 defines a locating hole 540.

The fan 6 is a centrifugal-type fan, and comprises an inlet (not shown) and an outlet 60. The inlet is positioned in alignment with and communicating with the opening 52 of the fan holder 5 for so that when the fan 6 is operated an airflow is generated to flow through the heat sink 40, the opening 52, the inlet to enter the fan 6. The hot air from the heat sink 40 leaves the fan via the outlet 60. The inlet and the outlet 60 are oriented to be perpendicular to each other. The fan 6 forms a pair of opposite projecting posts 64 corresponding to the lugs 54 of the fan holder 5. Each projecting post 64 defines a threaded hole (not labeled) corresponding to the locating hole 540 of the lug 54.

Referring to FIGS. 1 to 3, in assembly, the fan holder 5 is mounted to the fan 6 by bringing screws (not shown) to extend through the locating holes 540 of the fan holder 5 and screw into the threaded holes of the projecting posts 64 of the fan 6. Thus, the fan 6 and fan holder 5 are connected together. The tongues 56 of the fan holder 5 are inserted into the mounting holes 26 of the first fixing member 2. Simultaneously, the combination of the fan 6 and the fan holder 5 is horizontally positioned on the top of the heat sink assembly 4. The operating portion 12 is moved to be received in the recess 580 of the receiving portion 58 and downwardly press the receiving portion 58. A front end of the operating portion 12 adjacent to the handle portion 14 clasps the catch 38 when the lever 1 rotates around an axis of the locating portion 10 in the sleeve 32 from a free open position to a closed position. The catch 38 has a recess (not labeled) opening downwardly and receiving the front end of the operating portion 12. The recess 580 of the receiving portion 58 opens upwardly; thus, the lever 1 can be securely located at the closed position. The fan holder 5 and the fan 6 are thus fixedly attached to the heat sink assembly 4 by the first and the second interlocking devices. In the present invention, the mounting of the fan 6 on the heat sink assembly 4 is quite easy and simple, and will not have an interference with other parts of the heat sink assembly 4 such as the fasteners 44 or other components on the PCB 7 even when the fan 6 is quite large.

When the fan 6 operates, heat radiated by the first and the second fins 404, 406 is drawn with an airflow to flow through the opening 52 of the fan holder 5 and the inlet of the fan 6 into the fan 6. The hot air is blown out of the fan 6 via the outlet 60 of the fan 6. The fins 404, 406 absorb the heat from the CPU. Accordingly, the heat generated by the CPU can be quickly dissipated.

During disassembly of the fan 6 and the fan holder 5, the operating portion 12 is further pressed downwardly and outwardly by manipulating the handle portion 14 until the operating portion 12 escapes from the catch 38 of the second fixing member 3. The operating portion 12 is then rotated upwardly around the locating portion 10 until the lever 1 is disengaged from the receiving portion 58 and the supporting portion 36. Thus, the fan holder 5 is separated from the second fixing member 3. The tongues 56 are drawn out from the mounting holes 26 of the first fixing member 2. Thus the fan holder 5 is disengaged from the first fixing member 2. Therefore, the fan holder 5 and the fan 6 can be easily detached from the heat sink assembly 4.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

We claim:
1. A heat dissipating device comprising:
a fan holder;
a fan having an inlet and an outlet and mounted on the fan holder;
a heat sink assembly comprising a heat sink having a heat spreader and a plurality of fins attached on the heat spreader, and at least one fixing member mounted on the heat sink; and at least one detachable interlocking device being formed by the fan holder and the at least one fixing member to lock the fan holder to the at least one fixing member; wherein a lever is pivotably mounted to the at least one fixing member, and the at least one detachable interlocking device comprises a receiving portion formed on the fan holder and a catch formed on the at least one fixing member, the lever engaging with the receiving portion and the catch.

2. The heat dissipating device of claim 1, wherein the at least one detachable interlocking device comprises a tongue formed on the fan holder and a mounting hole defined in the at least one fixing member, the tongue is engaged in the mounting hole.

3. The heat dissipating device of claim 2, wherein the at least one fixing member comprises a mounting plate and a wing extending upwardly from the mounting plate, the mounting hole is defined at a joint of the mounting plate and the wing.

4. The heat dissipating device of claim 1, wherein the lever comprises a locating portion and an operating portion extending perpendicularly from an end of the locating portion.

5. The heat dissipating device of claim 4, wherein the at least one fixing member comprises a sleeve formed at an edge thereof for pivotably receiving the locating portion of the lever.

6. The heat dissipating device of claim 5, wherein the at least one fixing member comprises a supporting portion bent downwardly from a lateral side thereof and adjacent to the sleeve, for supporting the operating portion of the lever.

7. The heat dissipating device of claim 6, wherein the fixing member further comprises a securing plate contacting the receiving portion for preventing the receiving portion from deforming due to a pressure of the operating portion acting on the receiving portion during operation of the lever.

8. The heat dissipating device of claim 1, wherein the fan holder comprises a pair of lugs located on diagonal corners of the heat sink, respectively.

9. The heat dissipating device of claim 1, wherein the fins comprises first fins and second fins, the second fins being disposed in front and rear of the first fins.

10. A heat dissipating device comprising:
a heat sink having a plurality of fins;
a first and a second fixing members mounted on the heat sink, the first fixing member comprising mounting holes, the second fixing member comprising a catch;
a lever pivotably mounted to the second fixing member and clasped by the catch;
a fan having an inlet and an outlet;
a fan holder on which the fan is mounted, the fan holder comprising tongues engaged in the mounting holes of the first fixing member and a receiving portion having a recess receiving the lever therein.

11. The heat dissipating device of claim 10, wherein the lever comprises a locating portion and an operating portion extending perpendicularly from an end of the locating portion, the fixing member comprises a sleeve formed at an edge thereof for pivotably receiving the locating portion of the lever therein.

12. The heat dissipating device of claim 10, wherein receiving portion generally has a U-shaped configuration.

13. A heat dissipation device comprising:
a heat sink having a bottom for thermally connecting with a heat-generating electronic device;
first and second fixing members secured on lateral sides of the heat sink, respectively, wherein the first fixing member comprises a hole therein and the second fixing member comprises a pivotable lever;
a fan holder comprising a tongue fitted in the hole of the first fixing member and a receiving portion wherein the lever engages in the receiving portion and exerts a downwardly pressing force on the receiving portion and thus the fan holder; and
a fan secured on the fan holder.

14. The heat dissipation device of claim 13, wherein the fan holder has a plate-like configuration with two opposite lugs through which screws extend to screw in the fan.

15. The heat dissipation device of claim 13 further comprising a heat pipe having an evaporating portion thermally connecting with the bottom of the heat sink and a condensing portion thermally connecting with the top of the heat sink.

16. The heat dissipation device of claim 13, wherein the second fixing member has a catch having a downwardly opening recess, the catch clasping the lever by receiving the lever in the recess.

17. The heat dissipation device of claim 16, wherein the receiving portion has a recess opening upwardly and receiving the lever therein.

18. The heat dissipation device of claim 17, wherein the fan is a centrifugal fan with a bottom inlet communicating with the heat sink via the fan holder and an outlet at a side of the fan.

* * * * *